(12) United States Patent
Hung et al.

(10) Patent No.: US 8,816,810 B2
(45) Date of Patent: Aug. 26, 2014

(54) INTEGRATED CIRCUIT TRANSFORMER

(75) Inventors: Cheng-Chou Hung, Hukou Township, Hsinchu County (TW); Cheng-Jyi Chang, Zhubei (TW); Tung-Hsing Lee, Lujhou (TW); Wei-Che Huang, Zhudong Township, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 100 days.

(21) Appl. No.: 13/474,677

(22) Filed: May 17, 2012

(65) Prior Publication Data
US 2013/0009741 A1 Jan. 10, 2013

Related U.S. Application Data

(60) Provisional application No. 61/504,763, filed on Jul. 6, 2011.

(51) Int. Cl.
*H01F 5/00* (2006.01)
(52) U.S. Cl.
USPC .......................................... 336/200
(58) Field of Classification Search
USPC .............................. 336/65, 200, 232; 257/531
See application file for complete search history.

(56) References Cited

U.S. PATENT DOCUMENTS

| | | | | |
|---|---|---|---|---|
| 6,696,910 | B2 * | 2/2004 | Nuytkens et al. | 336/200 |
| 7,164,339 | B2 * | 1/2007 | Huang | 336/200 |
| 7,750,787 | B2 * | 7/2010 | Yoon et al. | 336/223 |
| 2010/0237974 | A1 * | 9/2010 | Yoon et al. | 336/170 |

* cited by examiner

*Primary Examiner* — Tuyen Nguyen
(74) *Attorney, Agent, or Firm* — McClure, Qualey & Rodack, LLP

(57) ABSTRACT

The invention provides an integrated circuit transformer disposed on a substrate. The integrated circuit transformer includes a first coiled metal pattern disposed on the substrate, comprising an inner loop segment and an outer loop segment. A second coiled metal pattern is disposed on the substrate, laterally between the inner loop segment and the outer loop segment. A dielectric layer is disposed on the first coiled metal pattern and the second coiled metal pattern. A first via is formed through the dielectric layer, electrically connecting to one of the first and second coiled metal patterns. A first redistribution pattern is disposed on the dielectric layer, electrically connecting to and extending along the first via, wherein the first redistribution pattern covers at least a portion of the first coiled metal pattern and at least a portion of the second coiled metal pattern.

20 Claims, 8 Drawing Sheets

INTEGRATED CIRCUIT TRANSFORMER

CROSS REFERENCE TO RELATED APPLICATIONS

This application claims the benefit of U.S. Provisional Application No. 61/504,763 filed Jul. 6, 2011, the entirety of which is incorporated by reference herein.

BACKGROUND OF THE INVENTION

1. Field of the Invention

The present invention relates to an integrated circuit transformer, and in particular, to an integrated circuit transformer with a high coupling factor (k).

2. Description of the Related Art

Transformers are increasingly integrated on-chip for various analog and radio frequency (RF) circuit applications. One criterion of transformers is a high coupling factor (k). The coupling factor of a transformer is dependent on the portion of the total flux lines that cuts both primary and secondary windings of the transformer. A high coupling factor means high energy is transferred from the primary to the secondary windings, wherein there is low energy loss for the transformer during transference.

The amount of turn counts of the primary and secondary windings are normally increased for the conventional integrated circuit transformer to improve the coupling factor (k). However, more turn counts require larger layout areas, thereby increasing fabrication costs.

Thus, a novel transformer with a high coupling factor is desirable.

BRIEF SUMMARY OF INVENTION

An integrated circuit transformer is provided. An exemplary embodiment of an integrated circuit transformer disposed on a substrate, comprises a first coiled metal pattern disposed on the substrate, comprising an inner loop segment and an outer loop segment. A second coiled metal pattern is disposed on the substrate, laterally between the inner loop segment and the outer loop segment. A dielectric layer is disposed on the first coiled metal pattern and the second coiled metal pattern. A first via is formed through the dielectric layer, electrically connecting to one of the first and second coiled metal patterns. A first redistribution pattern is disposed on the dielectric layer, electrically connecting to and extending along the first via, wherein the first redistribution pattern covers at least a portion of the first coiled metal pattern and at least a portion of the second coiled metal pattern.

Another exemplary embodiment of an integrated circuit transformer includes an integrated circuit transformer disposed on a substrate, comprising a first coiled metal pattern disposed on the substrate, comprising an inner loop segment and an outer loop segment. A second coiled metal pattern is disposed on the substrate, laterally between the inner loop segment and the outer loop segment. A first T-shaped conductive feature is disposed on the first coiled metal pattern and the second coiled metal pattern, electrically connecting to one of the first and second coiled metal patterns, wherein the first T-shaped conductive feature covers both the first and second coiled metal patterns.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 1b is a cross section view taken along A-A' line of FIG. 1a.

FIG. 2b is a cross section view taken along A-A' line of FIG. 2a.

FIG. 2c is a cross section view taken along B-B' line of FIG. 2a.

FIG. 3b is a cross section view taken along A-A' line of FIG. 3a.

FIG. 3c is a cross section view taken along B-B' line of FIG. 3a.

FIG. 4b is a cross section view taken along A-A' line of FIG. 4a.

DETAILED DESCRIPTION OF INVENTION

Figure 1A:
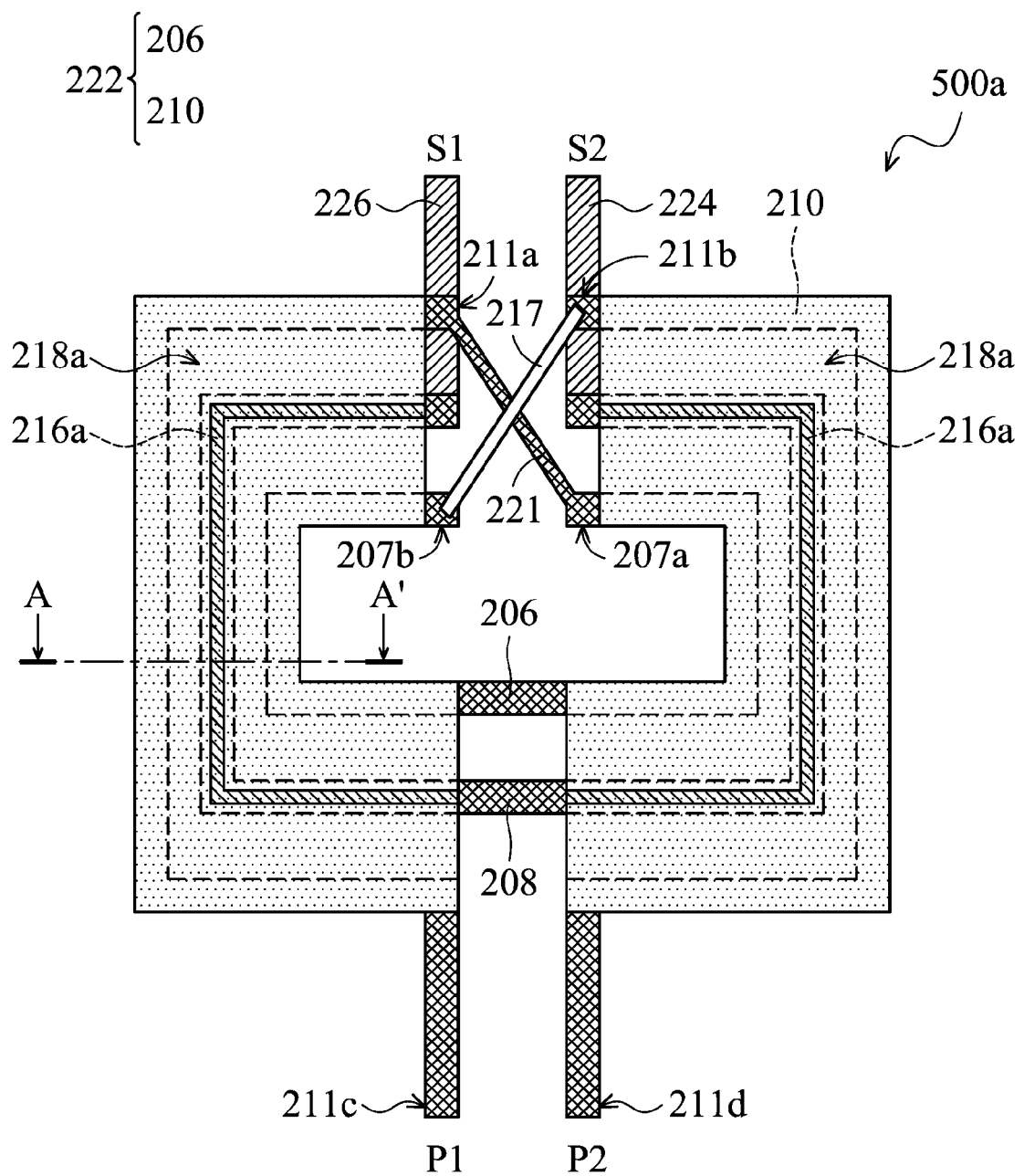
FIG. 1a is a top view of one exemplary embodiment of an integrated circuit transformer of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 1B:
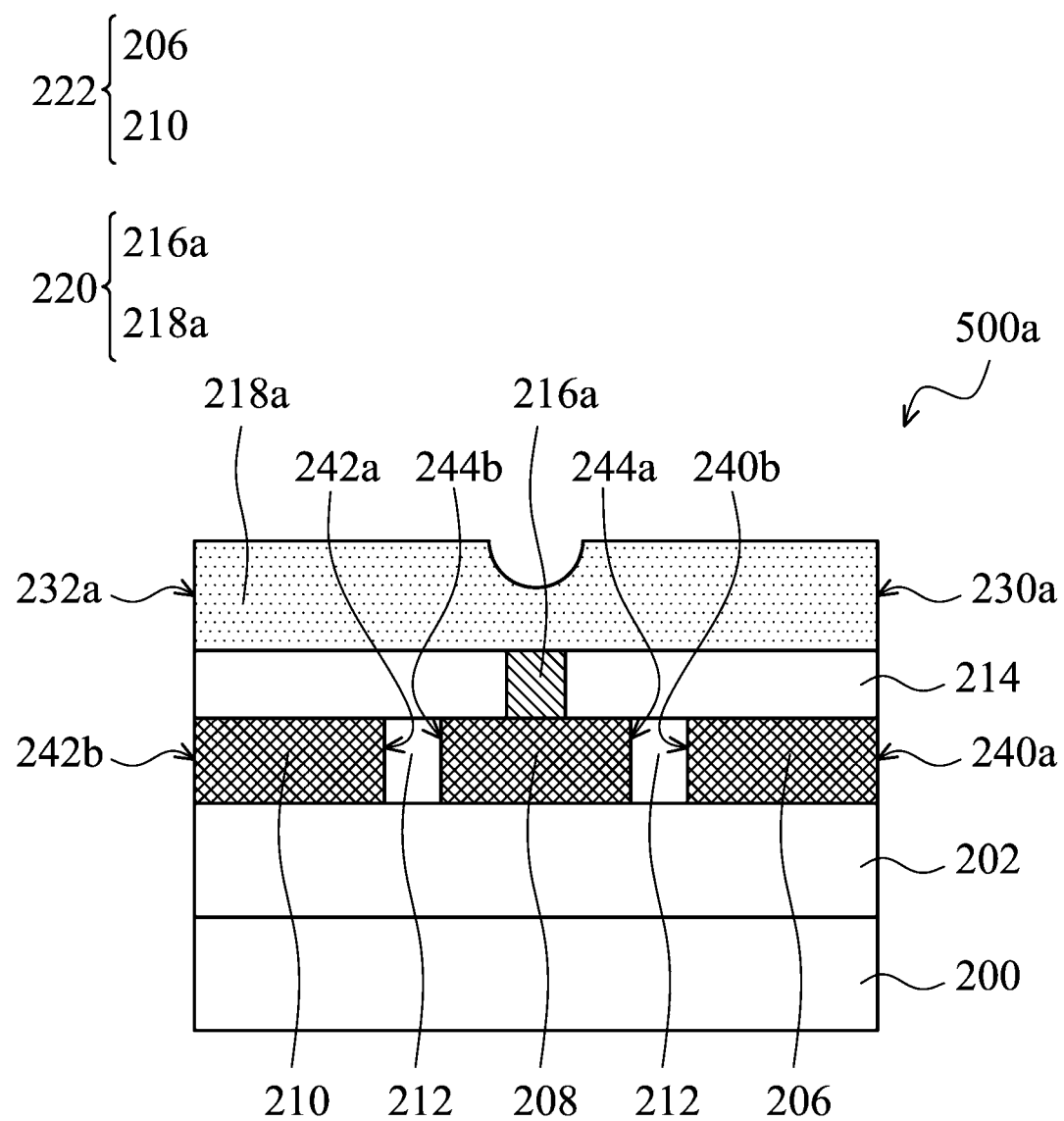

FIG. 1a is a top view of one exemplary embodiment of an integrated circuit transformer 500a of the invention. FIG. 1b is a cross section view taken along A-A' line of FIG. 1a. One exemplary embodiment of an integrated circuit transformer is an on-chip transformer. As shown in FIGS. 1a and 1b, the integrated circuit transformer 500a is disposed on a substrate 200 with a dielectric layer 202 formed thereon. A first coiled metal pattern 222 and a second coiled metal pattern 208 are disposed on the substrate 200. The first coiled metal pattern 222 and the second coiled metal pattern 208 have a similar shape and are parallel to each other. The shape of the first coiled metal pattern 222 and the second coiled metal pattern 208 may comprise square, octagonal or circular shapes. In one embodiment, the first coiled metal pattern 222 and the second coiled metal pattern 208 are formed by patterning a top metal layer (not shown) of the integrated circuit. Also, the first coiled metal pattern 222 and the second coiled metal pattern 208 are at the same layer level; that is to say, the first coiled metal pattern 222 and the second coiled metal pattern 208 are coplanar. In one embodiment, the first coiled metal pattern 222 may serve as a primary winding and the second coiled metal pattern 208 may serve as a secondary winding of the integrated circuit transformer 500a. The first coiled metal pattern 222 comprises an inner loop segment 206 and an outer loop segment 210. The second coiled metal pattern 208 is disposed laterally between the inner loop segment 206 and the outer loop segment 210. The second coiled metal pattern 208 has two terminals connect to two isolated metal patterns 224 and 226. The metal patterns 224 and 226 are respectively coupled to switches S1 and S2 for an induced current transmission. The metal patterns 224 and 226 have a layer level lower than the first coiled metal pattern 222 and the second coiled metal pattern 208. A terminal 207a of the inner loop segment 206 connects to a terminal 211a of the outer loop segment 210 by a metal pattern 221. The metal pattern 221, the first coiled metal pattern 222 and the second coiled metal pattern 208 are at the same layer level; that is to say, the metal pattern 221, the first coiled metal pattern 222 and the second coiled metal pattern 208 are coplanar.

A dielectric layer 214 is disposed on the first coiled metal pattern 222 and the second coiled metal pattern 208. In this embodiment, a via fin 216a is formed through the dielectric layer 214, electrically connecting to the second coiled metal pattern 208. In another embodiment, a series of separate vias (not shown) may be used to replace the via fin 216a to electrically connect to the second coiled metal pattern 208. Also, another via fin 217 is formed through the dielectric layer 214 for electrical connection between another terminal 207b of the inner loop segment 206 to another terminal 211b of the outer loop segment 210. Therefore, the inner loop segment 206 is connected to the outer loop segment 210 through the via fin 217 and the metal pattern 221. Terminals 211c and 211d of the outer loop segment 210 of the first coiled metal pattern 222 respectively electrically connect to switches P1 and P2 for input current transmission. As shown in FIG. 1a, the via fins 216a and 217 have a stripe-shaped from the top view. The via fin 216a extends along the second coiled metal pattern 208, and the via fin 217 extend from the terminal 207b of the inner loop segment 206 to the terminal 211b of the outer loop segment 210. In another embodiment, a series of the separate vias, which is used to replace the via fin 216a, may be arranged along the second coiled metal pattern 208. In one embodiment, the via fin 216a is formed with other pillared-shape vias for electrical connections of bonding pads.

As shown in FIGS. 1a and 1b, a redistribution pattern 218a is disposed on the dielectric layer 214, electrically connecting to and extending along the via fin 216a. As shown in FIG. 1a, the redistribution pattern 218a covers both the first and second coiled metal patterns 222 and 208 from the top view. The redistribution pattern 218a has a shape similar to the first and second coiled metal patterns 222 and 208, but a width of the redistribution pattern 218a is the same as the total width of the second coiled metal pattern 208, the inner loop segment 206 and the outer loop segment 210 of the first coiled metal pattern 222, and spacings between the second coiled metal pattern 208 and the inner loop segment 206 and the outer loop segment 210 of the first coiled metal pattern 222. The redistribution pattern 218a laterally extends from the second coiled metal pattern 208 to both an inner edge 240a of the inner loop segment 206 and an outer edge 242b of the outer loop segment 210. The redistribution pattern 218a has a pair of parallel edges 230a and 232a aligning to the inner edge 240a of the inner loop segment 206 and the outer edge 242b of the outer loop segment 210, respectively. From a cross section view of the integrated circuit transformer 500a shown in FIG. 1b, the redistribution pattern 218a and the via fin 216a may collectively construct a T-shaped conductive feature 220a, serving as an extending portion of the second coiled metal pattern 208. In another embodiment, the redistribution pattern 218a and a series of the separate vias used to replace the via fin 216a may also collectively construct a T-shaped conductive feature 220a from a cross section view of the integrated circuit transformer 500a shown in FIG. 1b. The T-shaped conductive feature 220a covers the second coiled metal pattern 208 and the inner loop segment 206 and the outer loop segment 210 of the first coiled metal pattern 222 adjacent to two opposite sidewalls 244a and 244b the second coiled metal pattern 208. Therefore, the coupling factor k of the integrated circuit transformer 500a is improved because the coupling effect not only occurs laterally between the second coiled metal pattern 208 and the inner loop segment 206/outer loop segment 210 of the first coiled metal pattern 222, but also occurs vertically between the redistribution pattern 218a (coupled to the second coiled metal pattern 208) and the inner loop segment 206/outer loop segment 210 of the first coiled metal pattern 222. Additionally, the via fin 216a is formed with other pillared-shape vias for electrical connections of bonding pads, and the redistribution pattern 218a is formed by patterning a conductive redistribution layer for bonding pads definition, so that no additional processes and design rules are required.

Figure 2A:
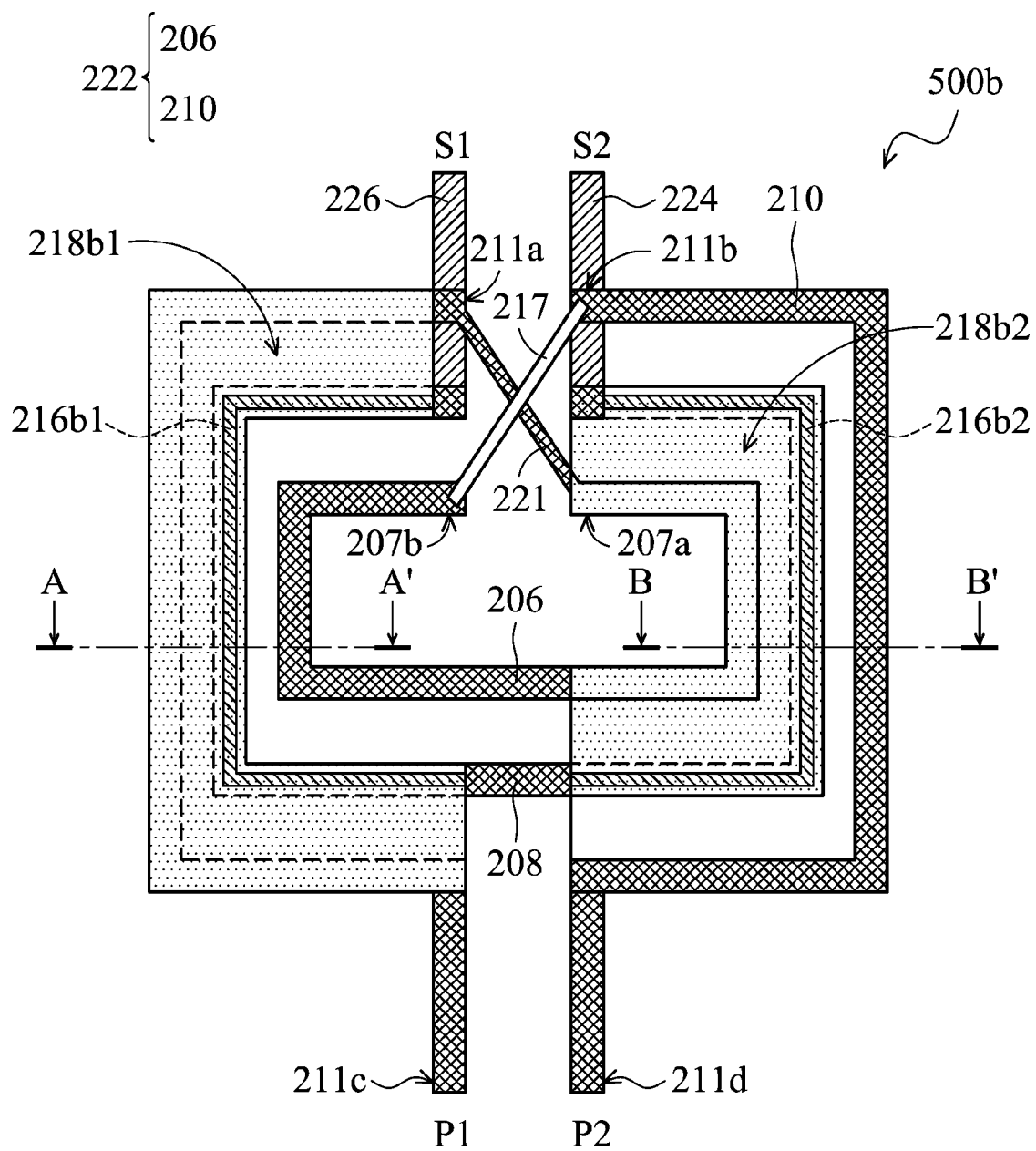
FIG. 2a is a top view of another exemplary embodiment of an integrated circuit transformer of the invention.
Figure 2B:
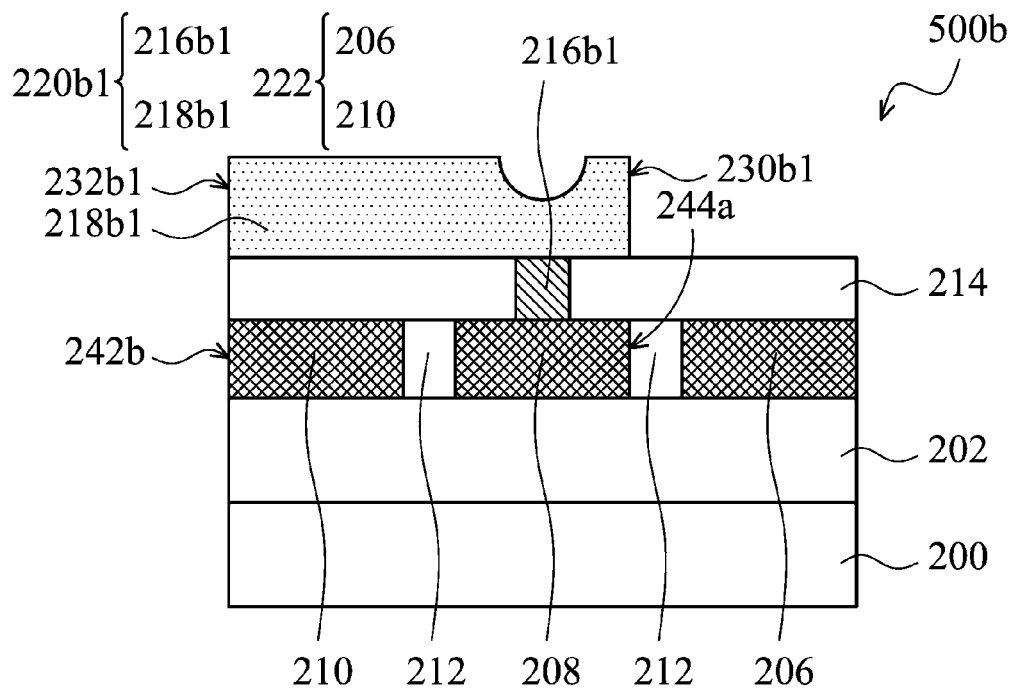
Figure 2C:
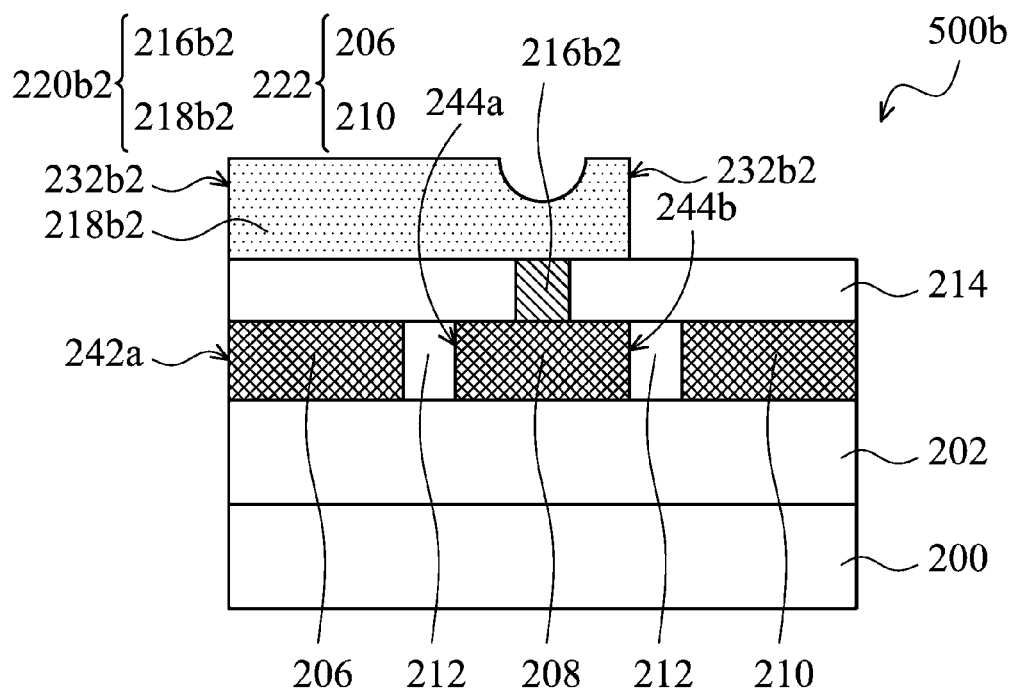

FIG. 2a is a top view of another exemplary embodiment of an integrated circuit transformer 500b of the invention. FIG. 2b is a cross section view taken along A-A' line of FIG. 2a. FIG. 2c is a cross section view taken along B-B' line of FIG. 2a. As shown in FIGS. 2a to 2c, in this embodiment, the via fins 216b1 and 216b2 separated from each other are formed through the dielectric layer 214, electrically connecting to the second coiled metal pattern 208. As shown in FIGS. 2a to 2c, the redistribution patterns 218b1 and 218b2 separated from each other are disposed on the dielectric layer 214, electrically connecting to and extending along the via fins 216b1 and 216b2, respectively. In one embodiment, the redistribution patterns 218b1 and 218b2 respectively cover both the first and second coiled metal patterns 222 and 208 from the top view. Specifically, the redistribution pattern 218b1 covers both the second coiled metal pattern 208 and the outer loop segment 210 of the first coiled metal pattern 222, and the redistribution pattern 218b1 covers both the second coiled metal pattern 208 and the inner loop segment 206 of the first coiled metal pattern 222. The redistribution patterns 218b1 and 218b2 have a shape similar to the first and second coiled metal patterns 222 and 208. A width of the redistribution pattern 218b1 is the same as the total width of the outer loop segment 210 of the first coiled metal pattern 222 and the second coiled metal pattern 208 and a spacing therebetween, and a width of the redistribution pattern 218b2 is the same as the total width of the inner loop segment 206 of the first coiled metal pattern 222 and the second coiled metal pattern 208 and a spacing therebetween. Specifically, as shown in FIGS. 2a and 2b, the redistribution pattern 218b1 laterally extends from the second coiled metal pattern 208 to the outer edge 242b of the outer loop segment 210 of the first coiled metal pattern 222. As shown in FIGS. 2a and 2c, the redistribution pattern 218b2 laterally extends from the second coiled metal pattern 208 to the inner edge 240a of the inner loop segment 206 of the first coiled metal pattern 222. The redistribution pattern 218b1 has a pair of parallel edges 230b1 and 232b1 aligning to the inner edge 244a of the second coiled metal pattern 208 and the outer edge 242a of the outer loop segment 210 of the first coiled metal pattern 222, respectively. Alternatively, the redistribution pattern 218b2 has a pair of parallel edges 230b2 and 232b2 aligning to the inner edge 240a of the inner loop segment 206 of the first coiled metal pattern 222 and the outer edge 244b of the second coiled metal pattern, respectively. From a cross section view of the integrated circuit transformer 500b shown in FIGS. 2b and 2c, the redistribution pattern 218b1 or 218b2 and the via fin 216b1 or 216b2 may collectively construct a T-shaped conductive feature 220b1 or 220b2, serving as an extending portion of the second coiled metal pattern 208. The T-shaped conductive feature 220b1/220b2 covers the second coiled metal pattern 208 and the outer loop segment 210/inner loop segment 206 of the first coiled metal pattern 222 adjacent to the single sidewall 244a/244b of the second coiled metal pattern 208. Therefore, the coupling factor k of the integrated circuit transformer 500b is improved because the coupling effect not only occurs laterally between the second coiled metal pattern 208 and the inner loop segment 206/outer loop segment 210 of the first coiled metal pattern 222, but also occurs vertically between the redistribution pattern 218b1/218b2 (coupled to the second coiled metal pattern 208) and the outer loop segment 210/inner loop segment 206 of the first coiled metal pattern 222. Additionally, the via fins 216b1 and 216b2 are formed with other pillared-shape vias for electrical connections of bonding pads, and the redistribution patterns 218b1 and 218b2 are formed by patterning a conductive redistribution layer for bonding pads definition, so that no additional processes and design rules are required.

Figure 3A:
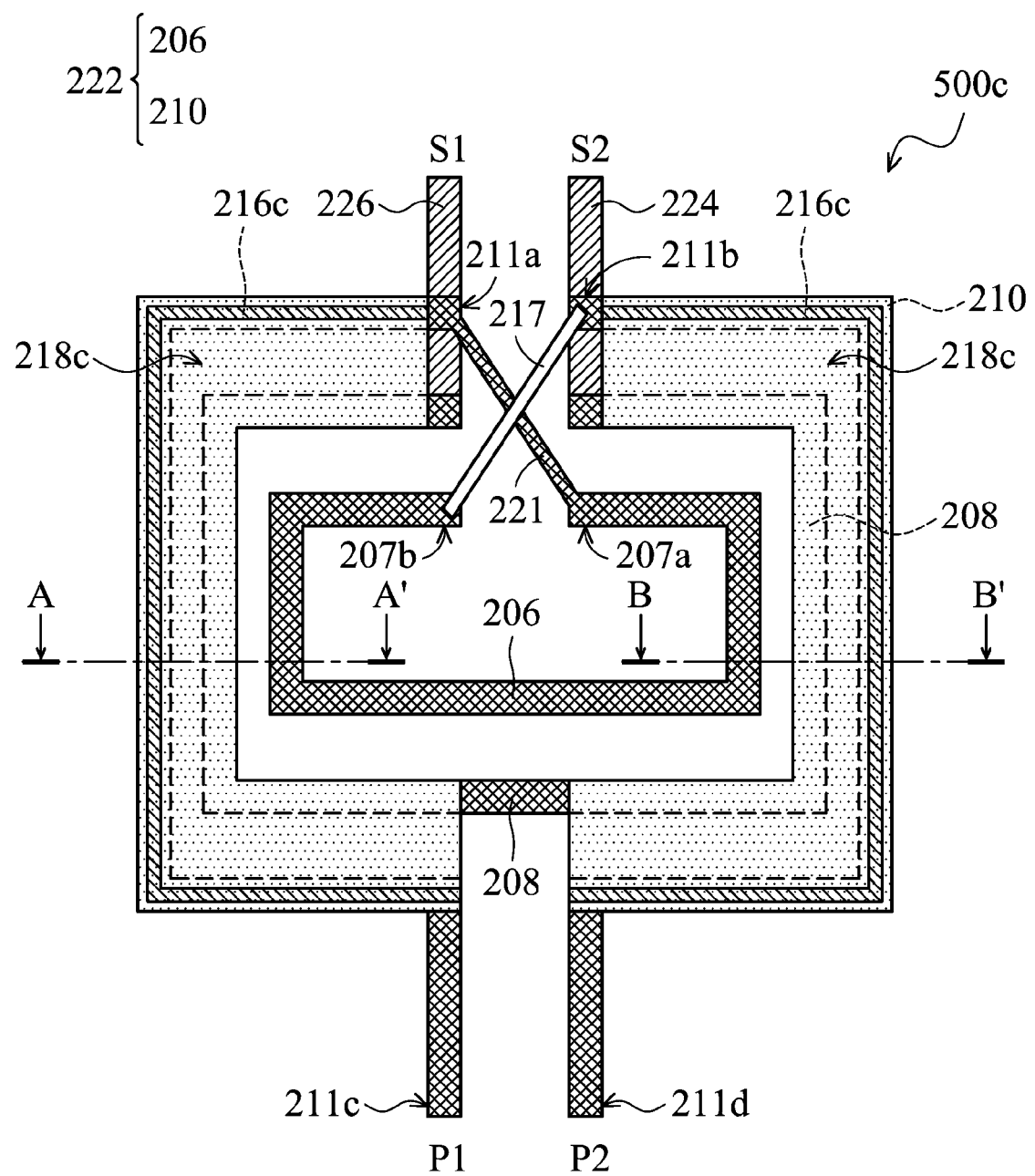
FIG. 3a is a top view of yet another exemplary embodiment of an integrated circuit transformer of the invention.
Figure 3B:
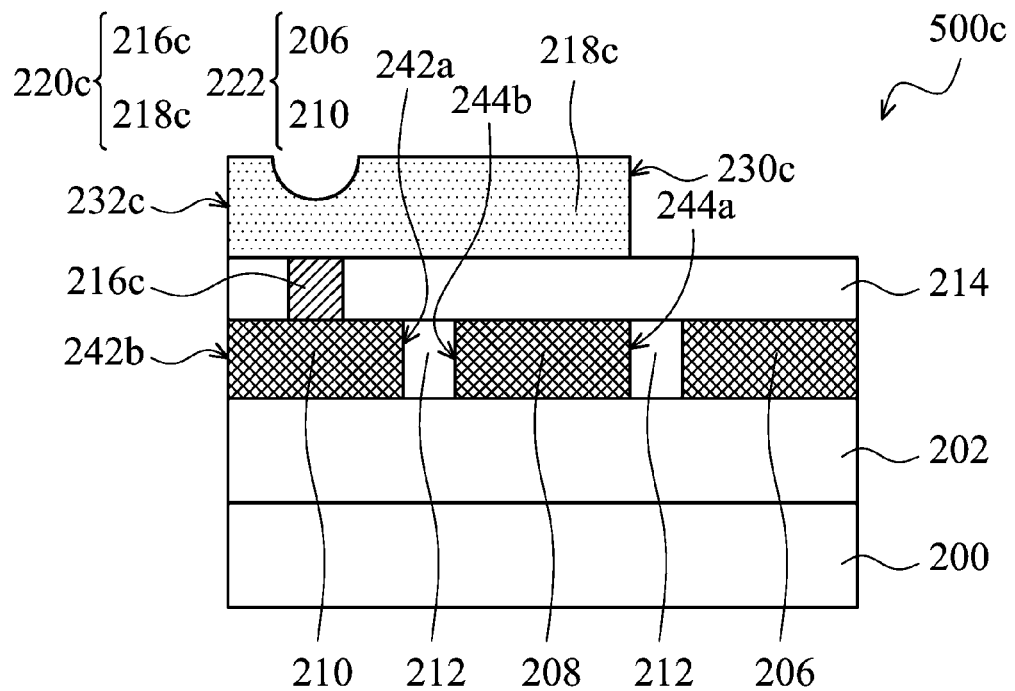
Figure 3C:
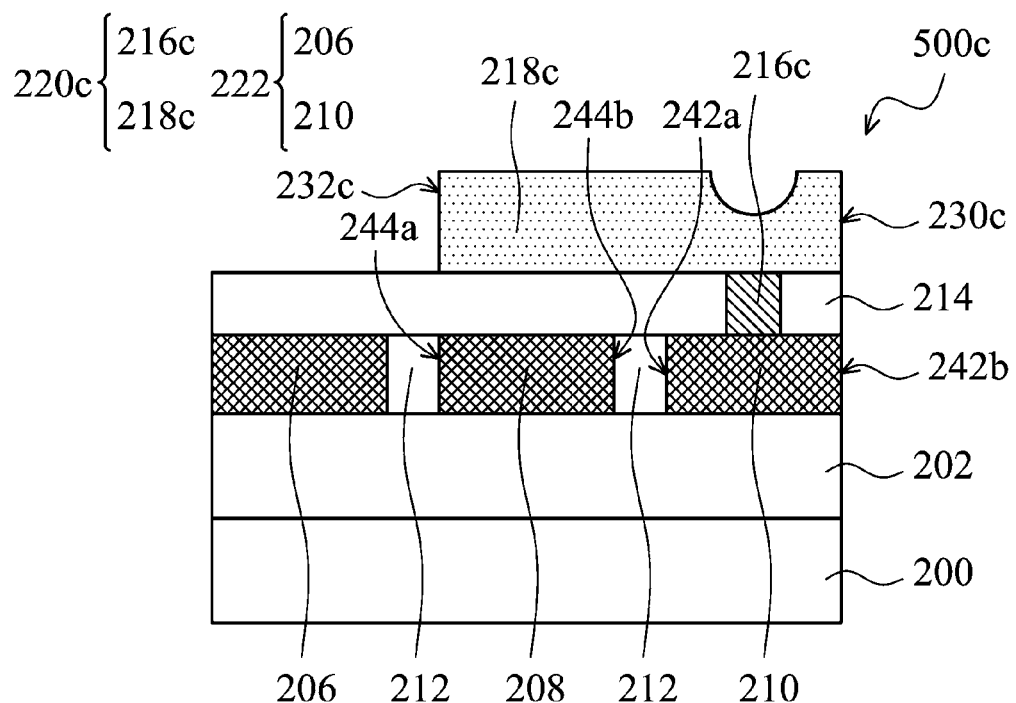

FIG. 3a is a top view of yet another exemplary embodiment of an integrated circuit transformer 500c of the invention. FIG. 3b is a cross section view taken along A-A' line of FIG. 3a. FIG. 3c is a cross section view taken along B-B' line of FIG. 3a. As shown in FIGS. 3a to 3c, in this embodiment, the via fin 216c is formed through the dielectric layer 214, electrically connecting to the outer loop segment 210 of the first coiled metal pattern 222. As shown in FIGS. 3a to 3c, the redistribution pattern 218c is disposed on the dielectric layer 214, electrically connecting to and extending along the via fin 216c. In one embodiment, the redistribution pattern 218c covers both the outer loop segment 210 of the first coiled metal pattern 222 and the second coiled metal pattern 208 from the top view. The redistribution pattern 218c has a shape similar to the first and second coiled metal patterns 222 and 208, but a width of the redistribution pattern 218c is the same as the total width of the outer loop segment 210 of the first coiled metal pattern 222 and the second coiled metal pattern 208 and a spacing therebetween. Specifically, as shown in FIGS. 3a to 3c, the redistribution pattern 218c laterally extends from the inner edge 244a of the second coiled metal pattern 208 to the outer edge 242b of the outer loop segment 210 of the first coiled metal pattern 222. The redistribution pattern 218c has a pair of parallel edges 230c and 232c aligning to the inner edge 244a of the second coiled metal pattern 208 and the outer edge 242a of the outer loop segment 210 of the first coiled metal pattern 222, respectively. From a cross section view of the integrated circuit transformer 500c shown in FIGS. 3a and 3c, the redistribution pattern 218c and the via fin 216c may collectively serve a T-shaped conductive feature 220c, serving as an extending portion of the outer loop segment 210 of the first coiled metal pattern 222. The T-shaped conductive feature 220c covers the outer loop segment 210 of the first coiled metal pattern 222 and the second coiled metal pattern 208 adjacent to the single sidewall 242a of the first coiled metal pattern 222. Therefore, the coupling factor k of the integrated circuit transformer 500c is improved because the coupling effect not only occurs laterally between the second coiled metal pattern 208 and an outer loop segment 210 of the first coiled metal pattern 222, but also occurs vertically between the redistribution pattern 218c (coupled to the outer loop segment 210 of the first coiled metal pattern 222) and the second coiled metal pattern 208. Additionally, the via fin 216c may be formed with other pillared-shape vias for electrical connections of bonding pads, and the redistribution pattern 218c may be formed by patterning a conductive redistribution layer for bonding pads definition, so that no additional processes and design rules are required.

Figure 4A:
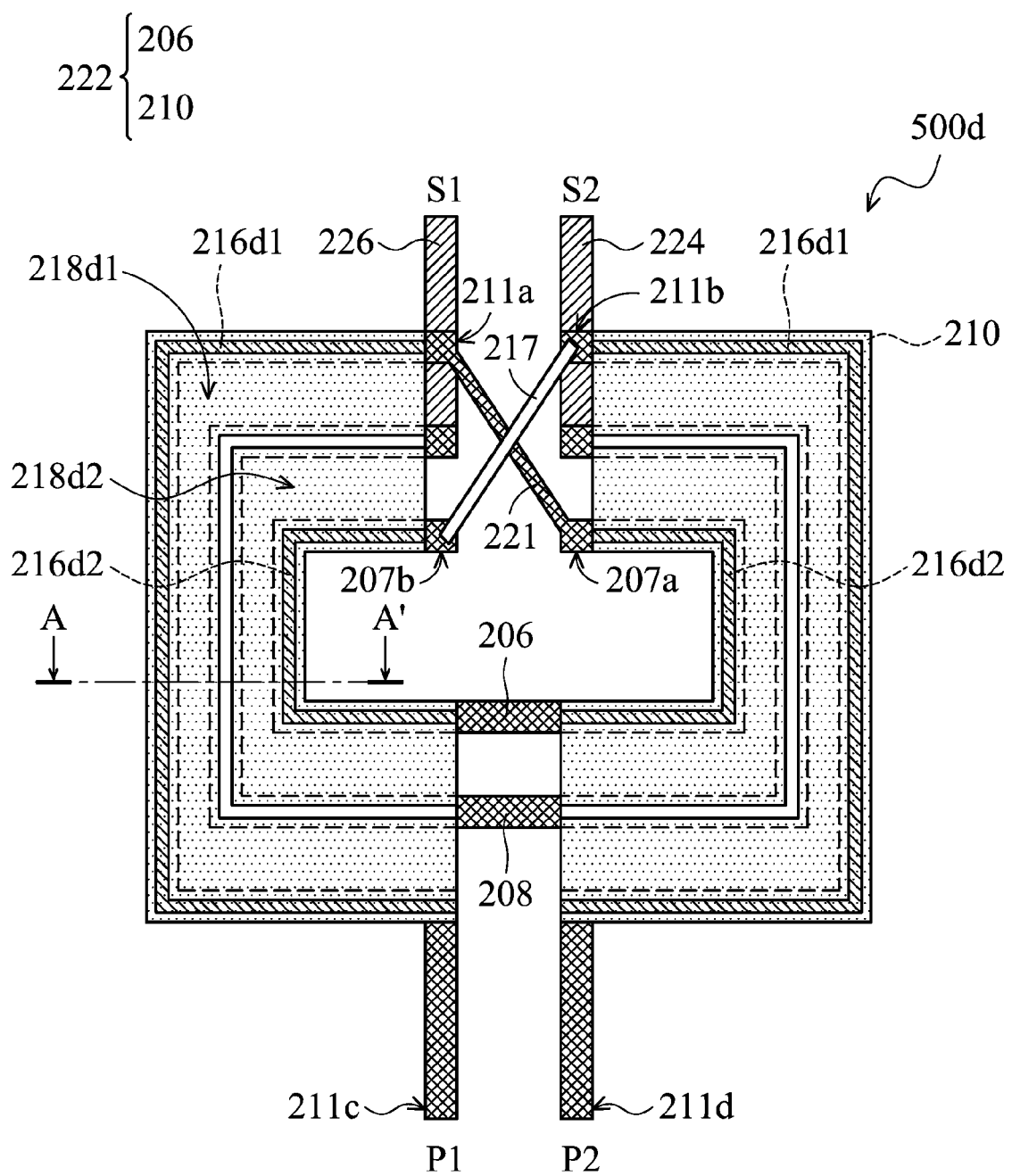
FIG. 4a is a top view of still yet another exemplary embodiment of an integrated circuit transformer of the invention.
Figure 4B:
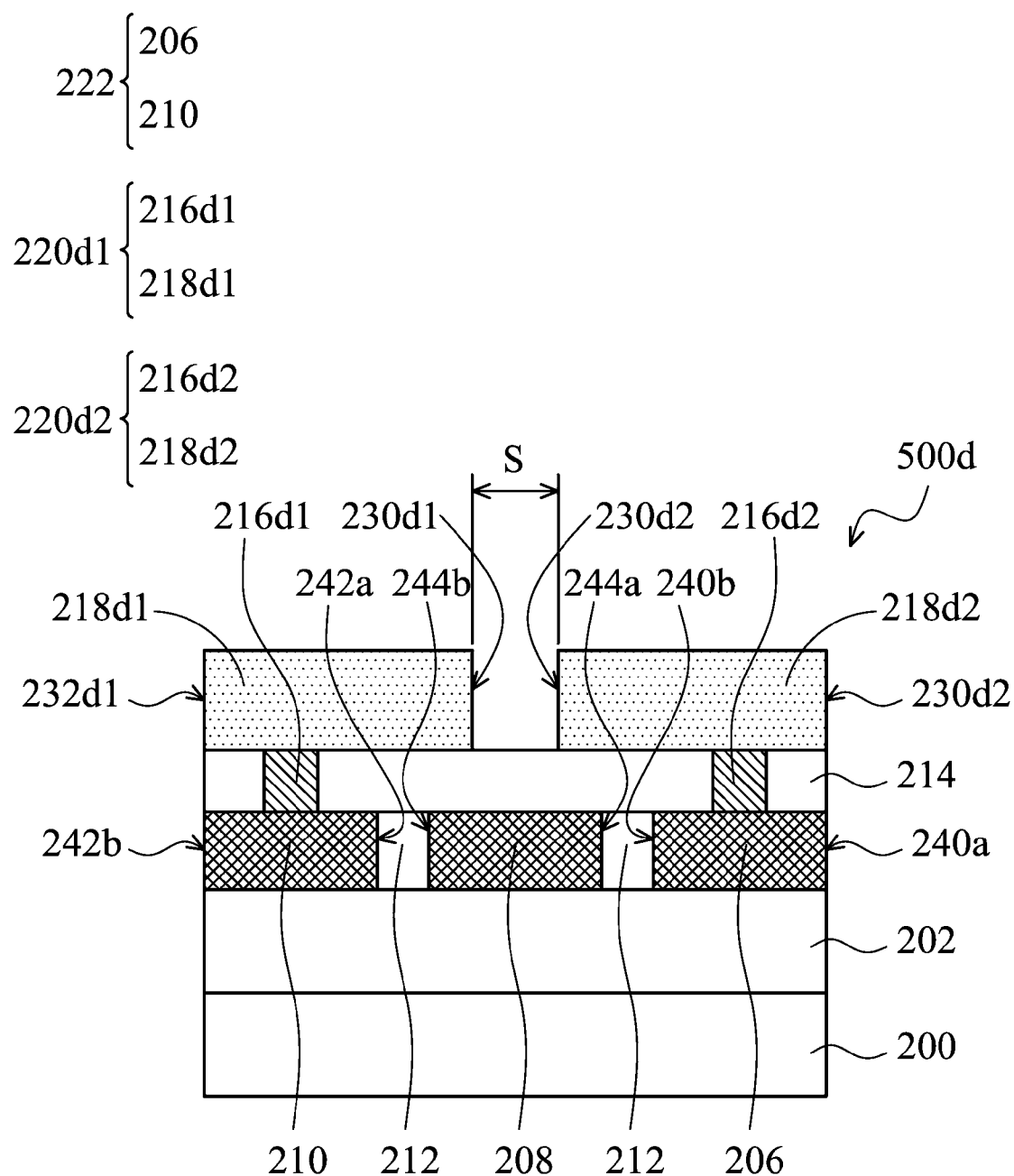

Alternatively, two T-shaped conductive features may be formed respectively connecting to the inner loop segment 206 and the outer loop segment 210 of the first coiled metal pattern 222. FIG. 4a is a top view of still yet another exemplary embodiment of an integrated circuit transformer 500d of the invention. FIG. 4b is a cross section view taken along A-A' line of FIG. 4a. As shown in FIGS. 4a to 4b, in this embodiment, the via fins 216d1 and 216d2 isolated from each other are formed through the dielectric layer 214, electrically connecting to the outer loop segment 210 and the inner loop segment 206 of the first coiled metal pattern 222, respectively. As shown in FIGS. 4a to 4b, the redistribution patterns 218d1 and 218d2 isolated from each other are disposed on the dielectric layer 214, electrically connecting to and extending along the fins 216d1 and 216d2, respectively. In one embodiment, the redistribution patterns 218d1 and 218d2 respectively covers both the outer loop segment 210/inner loop segment 206 of the first coiled metal pattern 222 and the second coiled metal pattern 208 from the top view. The redistribution patterns 218d1 and 218d2 have a shape similar to the first and second coiled metal patterns 222 and 208. A width of the redistribution pattern 218d1/218d2 is larger than a total width of the outer loop segment 210/inner loop segment 206 of the first coiled metal pattern 222 and a spacing between the outer loop segment 210/inner loop segment 206 of the first coiled metal pattern 222 and second coiled metal pattern 208. Specifically, as shown in FIGS. 4a to 4b, the redistribution pattern 218d1 laterally extends from the outer edge 242b of the outer loop segment 210 of the first coiled metal pattern 222 to a portion of the second coiled metal pattern 208, and the redistribution pattern 218d2 laterally extends from the inner edge 240a of the inner loop segment 206 of the first coiled metal pattern 222 to a portion of the second coiled metal pattern 208. The redistribution pattern 218d1 has a pair of parallel edges 230d1 and 232d1 aligning to the outer edge 242b of the outer loop segment 210 of the first coiled metal pattern 222 and the outer edge 244b of the second coiled metal pattern 208, respectively. Alternatively, the redistribution pattern 218d2 has a pair of parallel edges 230d2 and 232d2 aligning to the inner edge 240a of the inner loop segment 206 of the first coiled metal pattern 222 and the inner edge 244a of the second coiled metal pattern 208, respectively. The redistribution patterns 218d1 and 218d2 are isolated from each other by a spacing S, which is directly over the second coiled metal pattern 208. From a cross section view of the integrated circuit transformer 500d shown in FIGS. 4a and 4b, the redistribution pattern 218d1/218d2 and the via fin 216d1/216d2 may construct a T-shaped conductive feature 220d1/220d2, serving as an extending portion of the outer loop segment 210/inner loop segment 206 of the first coiled metal pattern 222. The T-shaped conductive feature 220d1/220d2c covers the outer loop segment 210/inner loop segment 206 of the first coiled metal pattern 222 and the second coiled metal pattern 208 adjacent to the first coiled metal pattern 222. Therefore, the coupling factor k of the integrated circuit transformer 500d is improved because the coupling effect not only occurs laterally between the second coiled metal pattern 208 and the inner loop segment 206/outer loop segment 210 of the first coiled metal pattern 222, but also occurs vertically between the redistribution pattern 218d1/218d2 (coupled to the outer loop segment 210/inner loop segment 206 of the first coiled metal pattern 222) and the second coiled metal pattern 208. Additionally, the via fins 216d1 and 216d2 may be formed with other pillared-shape vias for electrical connections of bonding pads, and the redistribution patterns 218d1 and 218d2 may be formed by patterning a conductive redistribution layer for bonding pads definition, so that no additional processes and design rules are required.

Exemplary embodiments of an integrated circuit transformer 500*a* to 500*d* are provided. The integrated circuit transformer comprises a T-shaped conductive feature to extend a coupling area between a primary winding and a secondary winding, which are disposed at the same layer level, of a transformer to improve the coupling factor k. The T-shaped conductive feature is at an upper level higher than the primary winding and the secondary winding of the transformer. The T-shaped conductive feature constructed by a via fin and a redistribution pattern, which is formed by patterning a conductive redistribution layer for bonding pads definition, thereabove, may electrically connect to one of the primary winding and the secondary winding, so that no additional processes and design rules are required. Further, the redistribution pattern of the T-shaped conductive feature vertically overlaps with both the primary winding and the adjacent secondary winding of the transformer. Therefore, the coupling factor k of the integrated circuit transformers 500*a* to 500*d* is improved because the coupling effect not only occurs laterally between the primary winding and the secondary winding, but also occurs vertically between the redistribution pattern (coupled to one of the primary winding and the secondary winding) and the primary winding or the secondary winding.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit transformer disposed on a substrate, comprising:
    a first coiled metal pattern disposed on the substrate, comprising an inner loop segment and an outer loop segment;
    a second coiled metal pattern disposed on the substrate, laterally between the inner loop segment and the outer loop segment;
    a dielectric layer disposed on the first coiled metal pattern and the second coiled metal pattern;
    a first via formed through the dielectric layer, electrically connecting to one of the first and second coiled metal patterns; and
    a first redistribution pattern disposed on the dielectric layer, electrically connecting to and extending along the first via, wherein the first redistribution pattern covers at least a portion of the first coiled metal pattern and at least a portion of the second coiled metal pattern.

2. The integrated circuit transformer as claimed in claim 1, wherein the first via electrically connects to the inner loop segment, and the first redistribution pattern laterally extends from the inner loop segment to the second coiled metal pattern.

3. The integrated circuit transformer as claimed in claim 2, wherein the first redistribution pattern has a pair of parallel edges which are aligned to a first edge of the first coiled metal pattern and a second edge of the second coiled metal pattern, respectively.

4. The integrated circuit transformer as claimed in claim 2, further comprising:
    a second via electrically connecting to the outer loop segment; and
    a second redistribution pattern extending and disposed on the dielectric layer, electrically connecting to and extending along the second via, wherein the second redistribution pattern laterally extends from the outer loop segment to the second coiled metal pattern.

5. The integrated circuit transformer as claimed in claim 1, wherein the first redistribution pattern and the second redistribution pattern are separated from each other.

6. The integrated circuit transformer as claimed in claim 1, wherein the first via electrically connects to the second coiled metal pattern, and the first redistribution pattern laterally extends from the inner loop segment to the outer loop segment.

7. The integrated circuit transformer as claimed in claim 6, wherein the first redistribution pattern has a pair of parallel edges which are aligned to a third edge of the inner loop segment and a fourth edge of the outer loop segment, respectively.

8. The integrated circuit transformer as claimed in claim 1, wherein the first via electrically connects to the second coiled metal pattern, and the first redistribution pattern laterally extends from the second coiled metal pattern to the inner loop segment or the outer loop segment.

9. The integrated circuit transformer as claimed in claim 6, wherein the first redistribution pattern has a pair of parallel edges which are aligned to a third edge of the second coiled metal pattern and a fourth edge of the inner loop segment or the outer loop segment, respectively.

10. The integrated circuit transformer as claimed in claim 9, wherein a width of the first redistribution pattern is the same as the total width of the second coiled metal pattern and the inner loop segment or the outer loop segment of the first coiled metal pattern, and a spacing between the second coiled metal pattern and the inner loop segment or the outer loop segment of the first coiled metal pattern.

11. The integrated circuit transformer as claimed in claim 8, wherein the width is the same as the total width of the second coiled metal pattern, the inner loop segment and the outer loop segment of the first coiled metal pattern, and spacings between the second coiled metal pattern and the inner loop segment and the outer loop segment of the first coiled metal pattern.

12. The integrated circuit transformer as claimed in claim 1, wherein the first coiled metal pattern and the second coiled metal pattern are disposed at the same layer level.

13. An integrated circuit transformer disposed on a substrate, comprising:
    a first coiled metal pattern disposed on the substrate, comprising an inner loop segment and an outer loop segment;
    a second coiled metal pattern disposed on the substrate, laterally between the inner loop segment and the outer loop segment; and
    a first T-shaped conductive feature disposed on the first coiled metal pattern and the second coiled metal pattern, electrically connecting to one of the first and second coiled metal patterns, wherein the first T-shaped conductive feature covers both the first and second coiled metal patterns.

14. The integrated circuit transformer as claimed in claim 13, wherein the first T-shaped conductive feature comprises:
    a first via formed through a dielectric layer on the first coiled metal pattern and the second coiled metal pattern; and
    a first redistribution pattern disposed on the dielectric layer, electrically connecting to and extending along the first via.

15. The integrated circuit transformer as claimed in claim 13, further comprising a second T-shaped conductive feature separated from the first T-shaped conductive feature, wherein the first and second T-shaped conductive features electrically connect to the inner loop segment and the outer loop segment of the first coiled metal pattern, respectively.

16. The integrated circuit transformer as claimed in claim 13, wherein the second T-shaped conductive feature comprises:
- a second via through the dielectric layer; and
- a second redistribution pattern extending and disposed on the dielectric layer, electrically connecting to and extending along the second via, wherein the first redistribution pattern laterally extends from the inner loop segment to the second coiled metal pattern, and the second redistribution pattern laterally extends from the outer loop segment to the second coiled metal pattern.

17. The integrated circuit transformer as claimed in claim 14, wherein the first via electrically connects to the second coiled metal pattern, and the first redistribution pattern laterally extends from the inner loop segment to the outer loop segment.

18. The integrated circuit transformer as claimed in claim 13, wherein a width of the first T-shaped conductive feature is the same as the total width of the second coiled metal pattern and the inner loop segment or the outer loop segment of the first coiled metal pattern, and a spacing between the second coiled metal pattern and the inner loop segment or the outer loop segment of the first coiled metal pattern.

19. The integrated circuit transformer as claimed in claim 17, wherein a width of the first T-shaped conductive feature is the same as the total width of the second coiled metal pattern, the inner loop segment and the outer loop segment of the first coiled metal pattern, and spacings between the second coiled metal pattern and the inner loop segment and the outer loop segment of the first coiled metal pattern.

20. The integrated circuit transformer as claimed in claim 17, wherein the first coiled metal pattern and the second coiled metal pattern are disposed at the same layer level.

* * * * *